United States Patent [19]

Bechtold et al.

[11] Patent Number: 4,945,251

[45] Date of Patent: Jul. 31, 1990

[54] GAS TARGET DEVICE

[75] Inventors: Volker Bechtold, Hagenbach; Hermann Schweickert, Karlsruhe, both of Fed. Rep. of Germany

[73] Assignee: Kernforschungszentrum Karlsruhe GmbH, Karlsruhe, Fed. Rep. of Germany

[21] Appl. No.: 324,024

[22] Filed: Mar. 16, 1989

[30] Foreign Application Priority Data

Mar. 17, 1988 [DE] Fed. Rep. of Germany ....... 3808973

[51] Int. Cl.[5] ............................................ H01J 37/08

[52] U.S. Cl. .............................. 250/492.1; 250/505.1; 376/194

[58] Field of Search ............. 250/432 R, 492.1, 505.1; 376/194, 195, 202, 201

[56] References Cited

U.S. PATENT DOCUMENTS

| | | | |
|---|---|---|---|
| 3,981,769 | 9/1976 | Winchell et al. | 376/201 |
| 4,324,980 | 4/1982 | Symmons | 250/505.1 |
| 4,800,060 | 1/1989 | Goldring | 376/194 |

*Primary Examiner*—Bruce C. Anderson

[57] ABSTRACT

A gas target device in which a gaseous target is bombarded with charged particles by means of a charged particle accelerator and radioisotopes are produced in a target chamber receiving the gaseous target a vacuum chamber is disposed in front of the gas target device so as to provide safety volume with gas-tight metal foils disposed at both ends thereof which metal foils however are permeable to the charged particles but provide a gas-tight seal with respect to the target chamber of the gas target device and the vacuum system of the accelerator. The metal foils are held by flanges disposed between the housing which are movable relative to one another to permit removal and replacement of the metal foils associated with the flange plates.

6 Claims, 1 Drawing Sheet

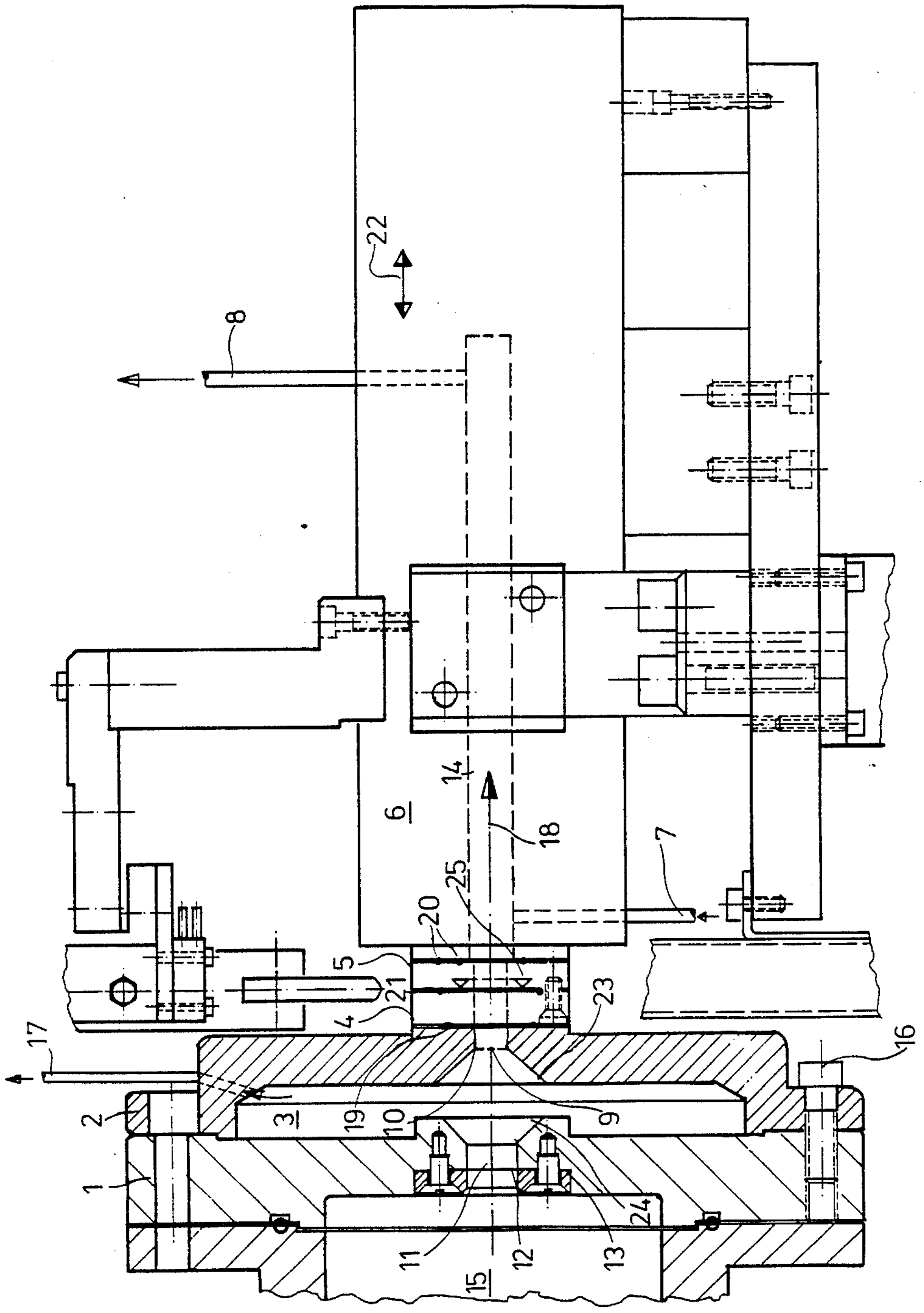
22
8
6
14
18
7
25
20
5
21
4
23
17
16
2
3
19
10
9
1
11
12
13
24
15

GAS TARGET DEVICE

BACKGROUND OF THE INVENTION

The present invention relates to a gas target device for bombarding a gaseous target with charged particles from a charged particle accelerator.

The production of certain radioisotopes requires the irradiation of highly enriched monoisotopic gases with high energy ions at elevated pressure. The greatest possible efficiency of the product is obtained by working with the highest possible intensity of the ion beam current. Since in the eligible range of energies of 10 to 30 MeV per neutron the charged particles have previously quickly lost their energies in solids, it is necessary to provide thin entrance foils as windows at the so-called gas targets. These entrance foils are exposed to the following impacts: pressure, temperature and radiation burden. Experimental experience has shown that rupture or the occurrence of minor leaks can never be completely ruled out.

The entrance window at one end of the chamber of a gas target device through which the accelerated and charged particles enter should be very thin; on the other hand, the gas in the target chamber must be kept at a specified pressure in order to obtain a good irradiation efficiency of the charged particles. In addition, radiation induced destruction of the window during particle irradiation has to be taken into consideration, as already stated. In an exemplary case gaseous xenon-124, 99.8% enrichment, is to be irradiated for six hours with a 30 MeV proton beam in order to obtain iodine-123 as the end product of a known chain of reactions. A great portion of iodine-123 produced in the target chamber is obtained immediately after irradiation.

The problems encountered are due firstly to the very thin film from which the window on the entrance side of the chamber of the gas target must be made and secondly to the fact that the gas chamber must be kept at an internal overpressure which might attain about 15 bar.

Thus, if the already mentioned very thin metal film ruptured during irradiation of the gas target, a considerable amount of radioisotopes produced in the target chamber would escape into the vacuum space of the irradiation apparatus, e.g., a cyclotron, causing contamination of the latter apparatus with the radioactive substances. Moreover, the loss of the enriched target gas would entail high costs.

If a conventional gas target is connected directly with the vacuum system of a beam guide system and/or a particle accelerator, the following drawbacks result in case defects occur at the entrance foils:

1. Losses of the costly gas.
2. Contamination (normally, the irradiated gases have become highly radioactive already after short irradiation periods) of the beam guide system and/or accelerator.
3. Loss of production associated with economic losses.

SUMMARY OF THE INVENTION

The object of the present invention is to provide a gas target device which can avoid the drawbacks mentioned before.

A gas target device for bombarding a gaseous target with charged particles from a charged particle accelerator has a charged particle entrance end disposed adjacent the accelerator and a target chamber arranged opposite the particle entrance end and adapted to contain a gaseous target to be irradiated by the charged particles from the accelerator. Between the entrance end and the target chamber there is disposed a vacuum chamber having charged particle entrance and exit windows disposed in the path of said charged particles from the accelerator to the target chamber with metal foils sealingly extending across the windows but adapted to permit passage of said charged particles through the vacuum chamber which vacuum chamber forms a safety space between the target chamber and the vacuum system of the adjacent particle accelerator.

By provision of the interim vacuum of the gas target according to the invention the loss of even minor gas volumes is avoided in case of a defect of the entrance foil and contamination of the beam generator is excluded. Furthermore, the interim vacuum offers the possibility of measuring with high sensitivity the tightness of the entrance foil towards the gas target volume. As a result, the entrance foil can be replaced in time so that the safety of the production process can be markedly enhanced.

Further details of the present invention are explained more comprehensively in the figure.

SHORT DESCRIPTION OF THE DRAWING

The sole FIGURE is a cross-sectional view of the gas target device with a vacuum chamber disposed in front of it.

DESCRIPTION OF A PREFERRED EMBODIMENT

According to the FIGURE the novel gas target device consists of a compartmentalized housing 1, 2, containing the vacuum space or chamber 3 as a safety volume, and the target housing 6, in the interior 14 of which irradiation takes place of, e.g., the xenon-124 gas mentioned. Between the housings 1, 2 and the target housing 6, two flange plates 4 and 5 are held in position, one of them, 4, facing the housing 2 and sealed with respect to said housing by means of an O-ring 19, and the other, 5, facing the target housing 6 and sealed by means of the concentric pair of O-rings 20. Both flange plates 4 and 5 are screwed together with a metal foil 10 disposed in between. The foil is compressed between the flange plates 4 and 5 and is sealed by a seal edge 25 and an O-ring 21 which extends concentrically around the seal edge 25 and supports the foil 10. The annular spaces formed between the pair of O-rings 20 and between the seal edge 25 and the O-ring 21 can be monitored for leaks by evacuation. The target housing 6 is movable in direction 22, and in the operating condition it is pressed towards the housing part 2 with the help of biasing elements not shown in the FIGURE which exert a predetermined force so that the flange plates 4 and 5 are firmly held in position and sealed between the housings.

As already said, the target housing 6 accommodates a target chamber 14 enclosing a target volume and provided with a feed line 7 and an evacuation line 8. The target chamber 14 is surrounded by cooling channels which are not shown in the FIGURE but which extend through the housing 6. The target chamber 14 and the vacuum space 3 are interconnected by way of channel 9 which extends centrically through the pair of flange plates 5, the channel being closed by the foil 10 disposed between plates 4 and 5 which, in turn, are fastened in the fashion stated before. The flange plates 4, 5 can be replaced remotely together with the foil. The gas-tight metal foil 10 is permeable to charged particles and separates the vacuum space 3 from the target space 6 while permitting the maintenance of a considerable pressure difference between the two. On the other side of the vacuum space 3 and in the front part of the housing 1 (seen in the direction of the beam), respectively, the beam entrance opening 11 extends coaxially with respect to channel 9 and the target chamber 14, respectively. The beam entrance opening 11 is closed by an additional foil 12 held in position in the opening 11 by a ring 13. The beam 18 originating in the vacuum chamber 15 of the beam generator passes through the foil 12, which is likewise permeable to charged particles, and through the beam entrance opening 11 and enters the vacuum space 3 from which it passes via the channel 9 and the foil 10 into the target chamber 14 which contains the gas to be irradiated. Thus, the vacuum space 3 forms a sort of prechamber of the target chamber 14, although it is sealed with respect to said target space and the vacuum space 15 of the beam generator by walls and foils 10 and 12, respectively, which are impermeable to gases. In this way, a separate vacuum can be maintained as a so-called safety volume in the vacuum space 3.

The housing including the vacuum space 3 consists of two parts, 1 and 2, which are fastened together by means of screws 16 so as to be vacuum tight. The suction line 17 is connected to the vacuum space 3 and extends through the housing. The suction line 17 permits maintenance of the vacuum and allows independent evacuation of the space 3.

It is an important feature that the dimensions of the vacuum space 3, that is, the safety volume, are coordinated with the volume of the target space 14: The safety volume must be larger by at least the pressure ratio existing between the target chamber 14 and the vacuum space 3 so that, in case of rupture of the foil 10, the expanded volume of the target chamber 14 can be accommodated and thereafter only a certain vacuum that is some reduced pressure needs to be maintained in the vacuum space 3. Since in case of rupture of the foil 10 due to excessive pressures and temperatures in the channel, very high flow velocities on the order of the sound velocity may occur in the channel in the direction toward the vacuum space 3, the transition from channel 9 to the vacuum space 3 is provided with a conical enlargement 23. On the opposite face of the vacuum space 3, that is, on the inner side of the housing part 1, a conical enlargement 24 is likewise provided which, in case of rupture, disperses the flow energy. Thus, the conical enlargements like the parts of channel 9 between the foils 10 and 11 are parts of the vacuum space 3. It is important that this space 3, thanks to its vacuum and dimensions, is capable of accommodating the entire volume of the target space 14 in the manner described.

Function of the Safety Volume

During irradiation, the vacuum space 3, which extends toroidally and spatially into the housings 1, 2 defining the safety volume, is kept under vacuum and monitored by means of pressure indication devices. If the metal foil 10 ruptures on the target side, the pressure indication of a pressure indicating device for the vacuum space 3 will exhibit higher values, whereas the pressure on the target side will drop. In such a case irradiation will be discontinued and the pair of flange plates 4, 5, after shifting of the target housing 6 in direction 22, are removed and replaced by a new pair of a new foil 10 installed therebetween. If, on the other hand, the foil 12 facing the beam 10 ruptures, a rise or drop in pressure will be indicated for the space 3, depending on the differential pressure with respect to the vacuum space 15, whereas in the target space 14 no change in pressure will be observed. In such a case, the irradiation process is also stopped and the foil 12 is replaced after removal of the ring 13.

LIST OF REFERENCE NUMERALS

1 Housing part
2 Housing part
3 Vacuum space or vacuum chamber
4 First flange plate
5 Second flange plate
6 Target housing
7 Feed line
8 Evacuation line
9 Channel
10 Metal foil
11 Beam entrance opening
12 Metal foil
13 Ring
14 Target chamber
15 Vacuum space
16 Screws
17 Suction line
18 Beam
19 O-ring
20 Pair of O-rings
21 O-ring
22 Direction of movement
23 Conical enlargement
24 Conical enlargement
25 Seal edge

What is claimed is:

1. A gas target device for bombarding a gaseous target with charged particles from a charged particle accelerator, said device having a vacuum chamber formed at its charged particle entrance end, said vacuum chamber having charged particle windows arranged opposite and in axial alignment with one another with metal foils sealingly extending across said windows which metal foils are translucent to said charged particles and a target chamber arranged adjacent said vacuum chamber and in axial alignment with the windows thereof so as to receive said charged particles passing through said vacuum chamber, said vacuum chamber forming a safety space between said target chamber and the adjacent vacuum system of said particle accelerator.

2. A device as claimed in claim 1, wherein said target chamber and said vacuum space are disposed in separate housings and a connecting channel extends between said housings, the housing of said target chamber being supported so as to be axially movable relative to the housing of the vacuum chamber so as to be biased toward said vacuum chamber.

3. A device as claimed in claim 2, wherein said metal foil between said vacuum chamber housing and said target chamber housing is supported by a flange which together with the foil is replaceable remotely after movement of said target chamber housing away from said vacuum chamber.

4. A device as claimed in claim 3, wherein said flange consists of two flange plates screwed together and receiving therebetween said foil thereby sealing said channel, said flange including a seal edge tightly engaging said foil for firmly supporting said foil between the housings and in sealing relationship.

5. A device as claimed in claim 4, wherein seal rings are disposed around said edge seal and between said flange plates and the spaces between said seal rings and between said edge seal are to be monitored.

6. A device as claimed in claim 1, wherein said foils consist of a metal of the group of aluminum, stainless steel, molybdenum, niobium and tantalum.

* * * * *